United States Patent
Yoon et al.

[11] Patent Number: 6,103,617
[45] Date of Patent: Aug. 15, 2000

[54] FABRICATING METHOD OF MULTI-LEVEL WIRING STRUCTURE FOR SEMICONDUCTOR DEVICE

[75] Inventors: Jin Young Yoon, Seoul; Young Chul Kim, Masan, both of Rep. of Korea

[73] Assignee: LG Semicon Co., Ltd., Choongcheongbuk-Do, Rep. of Korea

[21] Appl. No.: 09/320,554

[22] Filed: May 27, 1999

[30] Foreign Application Priority Data

May 28, 1998 [KR] Rep. of Korea .................. 98/19455
Dec. 29, 1998 [KR] Rep. of Korea .................. 98/60251

[51] Int. Cl.[7] .............................................. H01L 21/4763
[52] U.S. Cl. .................... 438/624; 438/634; 438/633; 438/637; 438/782
[58] Field of Search ..................... 438/624, 637, 438/638, 633, 634, 622, 782; 257/758

[56] References Cited

U.S. PATENT DOCUMENTS 4,789,648 12/1988 Chow et al. .................. 438/633
4,832,789 5/1989 Cochran et al. ................ 438/624
5,677,001 10/1997 Wang et al. ................... 438/782

OTHER PUBLICATIONS

Wolf et al., Silicon Processing, vol. 1, pp., 409–413, 430–434, 1986.

*Primary Examiner*—Charles Bowers
*Assistant Examiner*—Hsien-Ming Lee
*Attorney, Agent, or Firm*—Morgan, Lewis & Bockius LLP

[57] ABSTRACT

A fabricating method of a multi-level wiring structure for a semiconductor device that improves the resolution of photoresist film pattern by reducing a photoresist film and is capable of fabricating a semiconductor device of a high reliability by using an improved via hole mask includes the steps of sequentially forming a first insulating film, a first etching stop film, a second insulating film and a second etching stop film on a lower conductive layer pattern, forming a trench by etching the second etching stop film, the second insulating film and the first etching stop film which corresponds to an upper conductive layer pattern, forming a photoresist film on an entire upper surface of the resultant semiconductor substrate so that a thin photoresist film at about 1000–3000 Å is formed on the second etching stop film, forming an opening on a predetermined portion of the trench by performing a photolithography, forming a via hole by etching the first insulating film through the opening, and filling a conductive material in the via hole and the trench.

12 Claims, 12 Drawing Sheets

FABRICATING METHOD OF MULTI-LEVEL WIRING STRUCTURE FOR SEMICONDUCTOR DEVICE

BACKGROUND OF THE INVENTION

1. Field of the Invention

The present invention relates to a fabricating method of a multi-level wiring structure for a semiconductor device, and more particularly to a fabricating method of a multi-level wiring structure for a semiconductor device using a dual damascene process.

2. Description of the Conventional Art

As the integration of a semiconductor device has increased, it became generalized to apply a multi-level wiring structure which has at least three levels of wiring. In a conventional art, such multi-level wiring structure is fabricated by repeatedly carrying out steps of forming a lower conductive layer pattern on a semiconductor substrate, forming an insulating layer on the lower conductive layer pattern to thereby electrically insulate the lower conductive layer pattern from an upper conductive layer pattern, selectively etching the insulating layer to thereby form a via hole for connecting the lower conductive layer pattern with the upper conductive layer pattern, and forming patterning a conductive layer on the via hole and the insulating layer pattern to thereby form the upper conductive layer pattern. However, according to the fabricating method of the conventional multi-level wiring structure, it is relatively simple to fabricate a simple multi-level wiring structure such as a single or double-level wiring structure. However, when it comes to at least three-level wiring structure, as the wiring level increases, components formed on the semiconductor substrate have severe step difference, which results in short between the lower and upper conductive layer patterns and break of the conductive patterns.

In order to solve the above problems, there has been introduced a damascene process as a fabricating method of a multi-level wiring structure. More specifically, in the damascene process, an insulating film is formed on a lower conductive layer pattern, a trench and a via hole are previously provided, the trench corresponding to an upper conductive layer pattern by etching the insulating film and the via hole being formed at a location corresponding to an interconnect which connects a lower conductive layer with an upper conductive layer, and a conductive film is filled in the trench and the via hole. Since such process has a flat top surface formed after forming the upper conductive layer pattern, the reliability of a semiconductor device is improved because no short or break between conductive wires occurs although the multi-level wiring process is performed.

The fabricating method for the multi-level wiring structure according to the conventional damascene process is disclosed in U.S. Pat. No. 4,789,648. FIGS. 1A through 1E sequentially illustrate an example of the fabricating method for the multi-level wiring structure using the conventional damascene process.

Figure 1A:
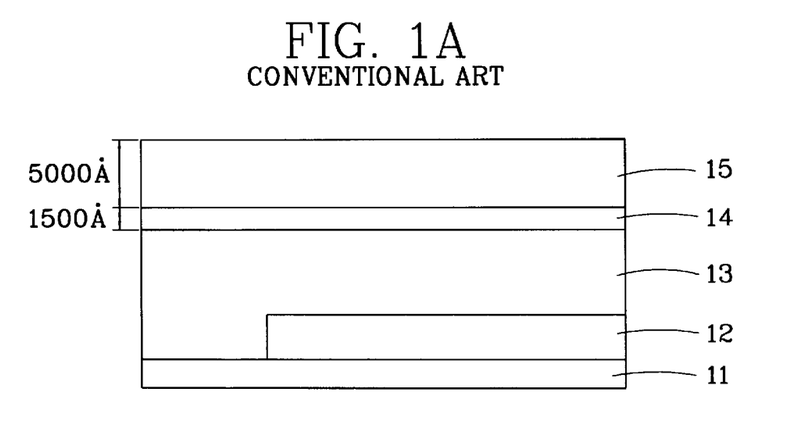
FIGS. 1A through 1E are diagrams illustrating an example of a fabricating method of a multi-level wiring structure for a conventional semiconductor device.

As shown therein, as can be seen in FIG. 1A, a lower conductive layer pattern 12 is formed on a portion of a semiconductor substrate 11, and a first oxide film 13 which is an insulating film is formed on the lower conductive layer pattern 12 and the semiconductor substrate 11. Next, a nitride film is formed as an etching stop film 14 on the first oxide film 13 and a second oxide film 15 is formed on the etching stop film 14 as the insulating film, the etching stop film 14 being formed at a thickness of about 1500 Å and the second oxide film being formed at a thickness of about 5000 Å.

Figure 1B:
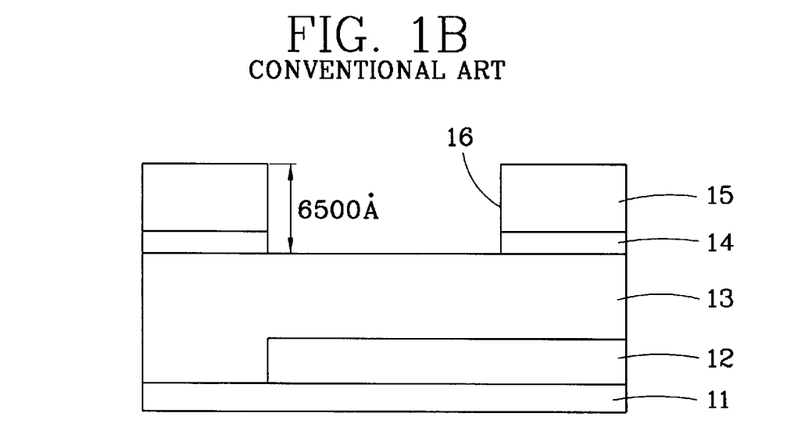

Next, as shown in FIG. 1B, the second oxide film 15 and the etching stop film 14 are partially etched to form a trench 16 having a shape corresponding to an upper conductive layer pattern. Here, a depth of the trench 16 is about 6500 Å (that is, the thickness of the etching stop film plus the second oxide film).

Then, a photoresist film is formed on a resultant upper surface of FIG. 1B. Here, a thickness of the photoresist pattern on the second oxide film 15 is to be about 8000–10000 Å because if the thickness of the photoresist film on the second oxide film 15 is formed below 8000 Å, during the etching process for forming the via hole the photoresist film is etched and at this time the second oxide film 15 formed right below the photoresist film might be undesirably etched. Accordingly, to prevent the second oxide film 15 from being etched, the thickness of the photoresist film should be thickly provided on the second oxide film 15. To form the photoresist film pattern on the second oxide film 15 at the thickness between 8000–10000 Å, a photoresist having 8 centi-poise (cP) of viscosity is formed by a rotary coating at 2000–3000 rpm. While, since the photoresist film of the very low viscosity is formed by the rotary coating, the surface level of the photoresist film formed on the oxide film is almost same as that of the photoresist film formed in the trench. Therefore, the thickness of the photoresist film formed in the trench 16 becomes about 14500–16500 Å, that is the depth of the trench plus the thickness of the photoresist film formed on the oxide film.

Figure 1C:
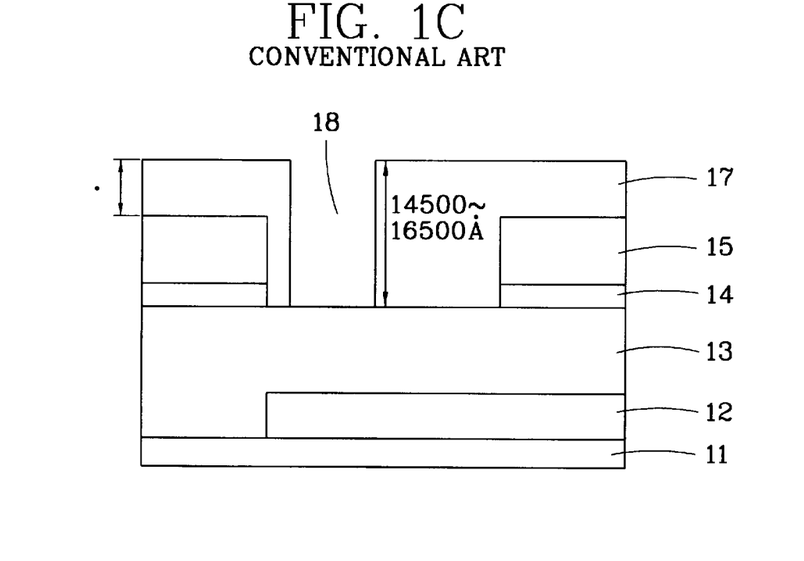
Figure 1D:
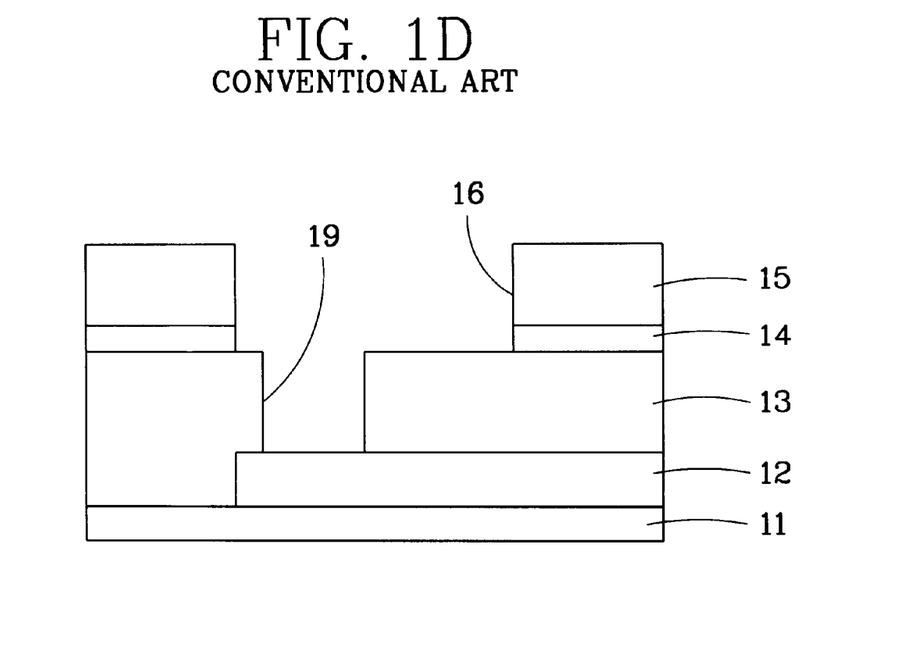
Figure 1E:
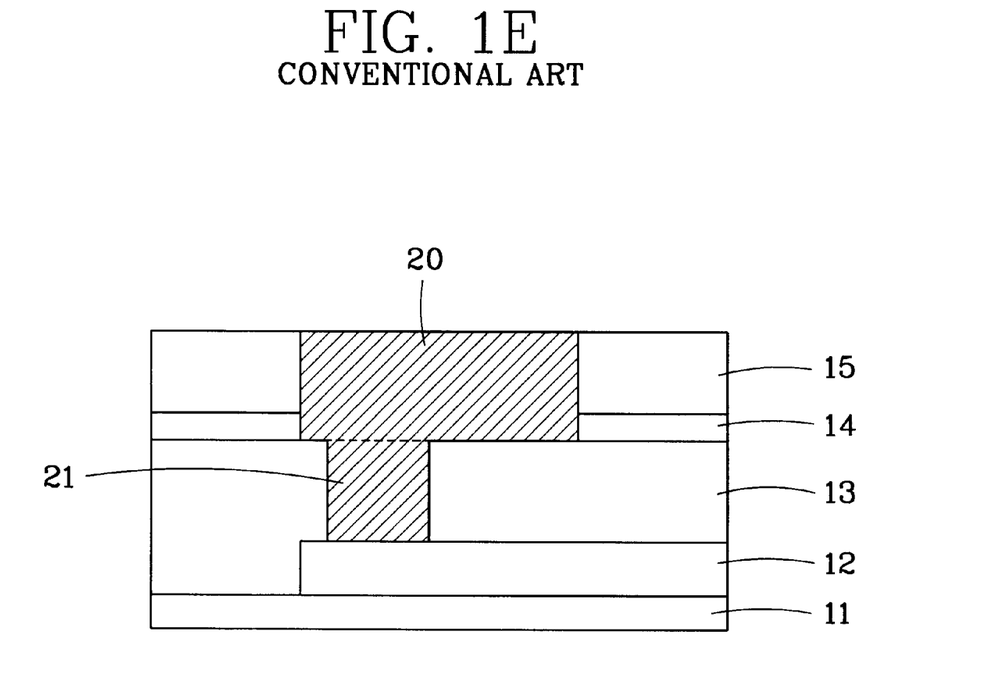

To form the via hole, as shown in FIG. 1C, a window 18 is formed by performing the photolithography process on a predetermined portion of the photoresist film formed at the trench. The photoresist film becomes a photoresist film pattern 17 with the window 18. Next, the first oxide film 13 is etched by using the photoresist pattern as a mask through the window 18, and then the photoresist film pattern 17 is removed for thereby removing a via hole 19 as can be seen in FIG. 1D. Lastly, a conductive layer (not shown) is formed on the entire surface of the structure of FIG. 1D to fill the via hole 19 and the trench 16, and a chemical mechanical polishing process is performed to form an upper conductive layer pattern 20 as well as an interconnect 21 for connecting the lower and upper conductive layer patterns 12, 20.

Figure 5:
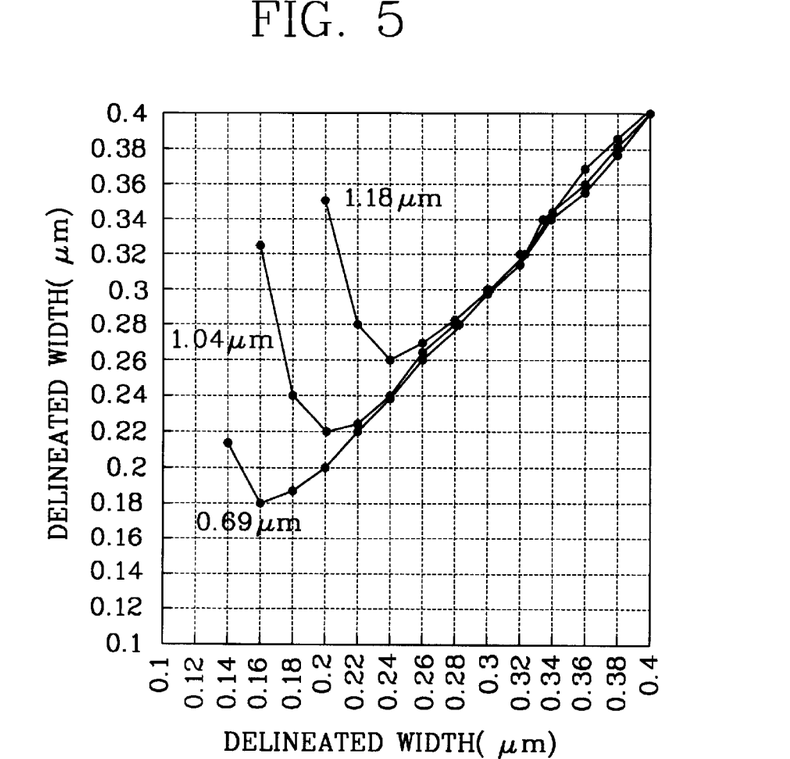
FIG. 5 is a graph illustrating relation between designed width and delineated width according to various thicknesses of a photoresist film.

However, in the fabricating method for the conventional multi-level wiring structure, there is a problem of performing the photoresist patterning to form the via hole under the condition in which the thickness of the photoresist film formed at the trench. However, in the general photolithography process, as the photoresist film becomes thick, the resolution decreases. That is, as shown in FIG. 5, when the thickness of the photoresist film is, for example, 6900 Å, the delineated width is 0.18 $\mu$m, while when the photoresist films have the thickness of 10400 Å and 11800 Å, the delineated widths are 0.22 $\mu$ and 0.26 $\mu$, respectively. That is, if the photoresist film is thickly formed, it is difficult to form a fine pattern. Recently, since the fabrication of at least 256 M DRAM is aimed for achieving a design rule under 0.18 $\mu$m, it seems that the design rule can not be achieved because it is impossible to thinly form the photoresist film by using the conventional process.

Further, a depth of focus is ranged between 0.4 to 0.6 $\mu$m in the currently developed photolithography process. However, because the photoresist film is formed at the thickness over 14000 Å in the conventional art, although the maximum depth of focus is applied, the photoresist film is thickly formed at the thickness at least twice the maximum depth of focus, that is over 12000 Å. Therefore, the thickness of the photoresist film is out of the allowable range of the depth of focus which leads to bad resolution of the photoresist film. Particularly, when the size of the via hole is very small under about 0.3 μm, bridge occurs between the photoresist film patterns and thus the via hole may not be formed. In addition, in the conventional art, when forming a via hole mask on a predetermined portion of the trench for forming the via hole, the mask has an opening portion which corresponds to the size of the via hole. Therefore, if the position arrange is not properly determined, the actual size of the via hole is formed smaller than the designed size thereof which results in increase in contact resistance between the upper and lower conductive lines or inferior contact therebetween.

SUMMARY OF THE INVENTION

Accordingly, the present invention is directed to a fabricating method of a multi-level wiring structure for a semiconductor device which obviates the problems and disadvantages due to the conventional art.

An object of the present invention is to provide a fabricating method of a multi-level wiring structure for a semiconductor device that improves the resolution of a photoresist film pattern by reducing the thickness of a photoresist film pattern.

Another object of the present invention is to provide a fabricating method of a multi-level wiring structure for a semiconductor device that enables the fabrication of a semiconductor device by forming an improved via hole mask having an opening wider than a via hole to thereby prevent contact resistance and inferior contact between upper and lower wirings.

To achieve these and other advantages and in accordance with the purpose of the present Invention, as embodied and broadly described, there is provided a fabricating method of a multi-level wiring structure for a semiconductor device includes the steps of sequentially forming a first insulating film, a first etching stop film, a second insulating film and a second etching stop film on a lower conductive layer pattern, forming a trench by etching the second etching stop film, the second insulating film and the first etching stop film which corresponds to an upper conductive layer pattern, forming a photoresist film on an entire upper surface of the resultant semiconductor substrate so that a thin photoresist film at about 1000–3000 Å is formed on the second etching stop film, forming an opening on a predetermined portion of the trench by performing a photolithography, forming a via hole by etching the first insulating film through the opening, and filling a conductive material in the via hole and the trench.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiment of the present invention, examples of which are illustrated in the accompanying drawings.

FIGS. 2A through 2F are plane diagrams sequentially illustrating a fabricating process for a multi-level wiring structure for a semiconductor device according to the present invention, and FIGS. 3A through 3F are diagrams which are vertically cross-sectioned in accordance with lines IIIi—IIIi (i–a~f) of FIGS. 2A through 2F, respectively. Therefore, components in FIGS. 2A through 2F which are the same as those of FIGS. 3A through 3F are labelled with the same reference numbers.

Figure 2A:
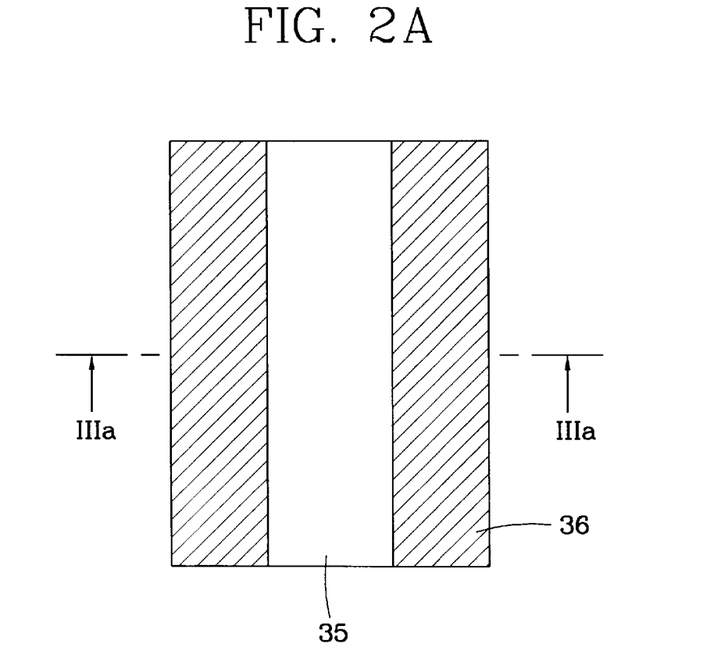
FIGS. 2A through 2F are plane diagrams sequentially illustrating a fabricating process for a multi-level wiring structure for a semiconductor device according to the present invention.
Figure 3A:
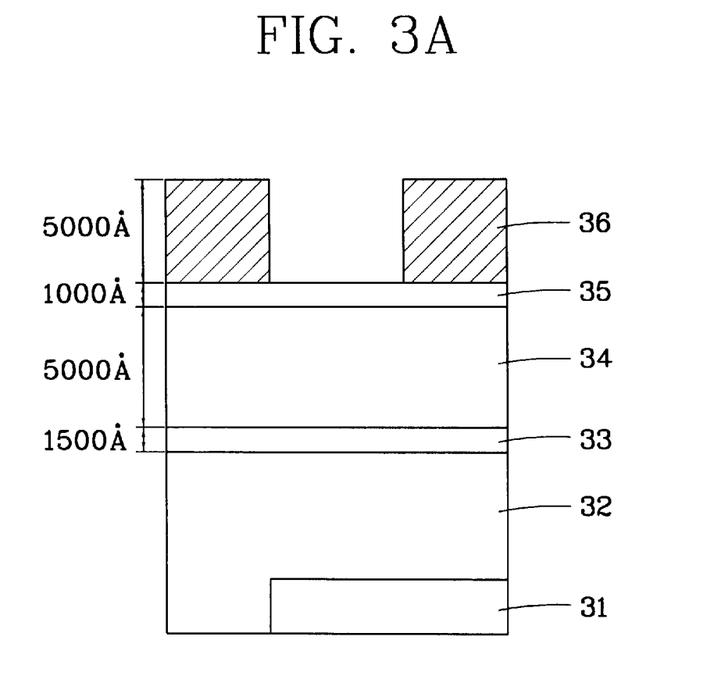
FIGS. 3A through 3F are vertical cross-sectional views of FIGS. 2A through 2F, respectively.

First, as shown in FIGS. 2A and 3A (the vertical cross-sectional diagram of FIG. 2A in accordance with a line IIIa—IIIa), a lower conductive layer pattern 31 is formed on a portion of a semiconductor pattern (not shown). Here, it is desirable that the material of the lower conductive layer pattern 31 is Al or Cu. Further, a first insulating film 32 is formed at a thickness of 5000 Å on the lower conductive layer pattern 31 and the semiconductor substrate (not shown). Then, a first etching stop film 33 of about 1500 Å, a second insulating film 34 of about 5000 Å and a second etching stop film 35 of about 1000 Å are sequentially formed on the first insulating film 32. Here, it is noted that the material of the first and second insulating films 32, 34 is a silicon oxide film or a tetra-ethyl-orthosilicate (TEOS) film formed by plasma enhanced chemical vapor deposition (PECVD), and each of the first and second etching stop films is preferably a silicon nitride film SixNy which has a high etching selection ratio with respect to the silicon oxide film or the TEOS film.

Next, a first photoresist pattern 36 is formed on the second etching stop film 35 at a thickness of about 5000 Å, the first photoresist pattern 36 serving as a mask for forming a trench and thus being referred to as a trench mask hereinafter.

Figure 2B:
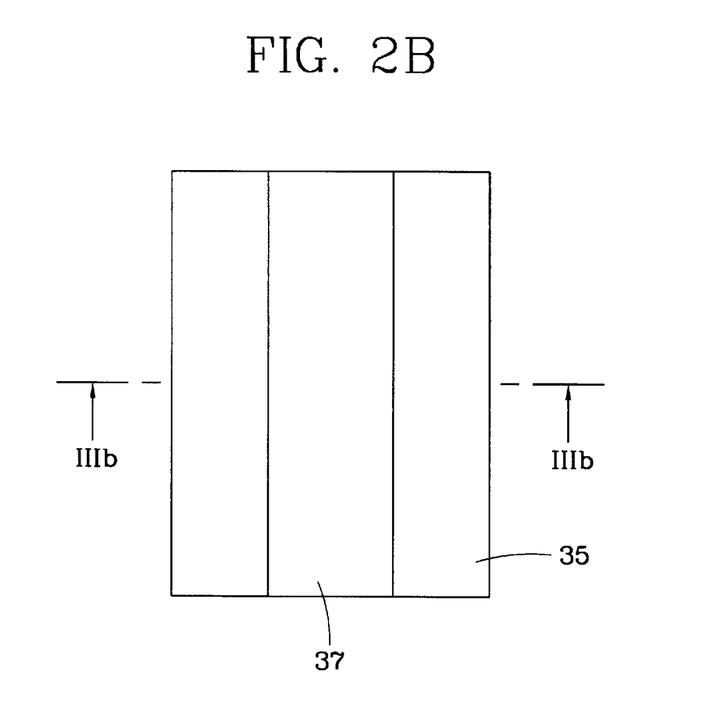
Figure 3B:
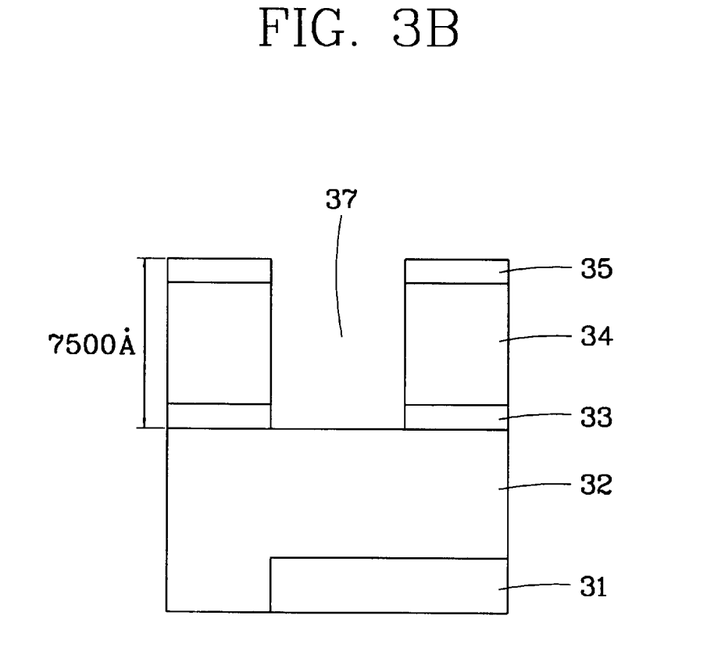

Next, as shown in FIG. 2B or 3B, a trench 37 is formed by sequentially etching the second etching stop film 35, the second insulating film 34 and the first etching stop film 33 by using the trench mask 36. Then, the trench mask 36 is removed and thus a bottom surface of the trench 37 becomes an upper surface of the first insulating film 32. Also, the depth of the trench 37 is about 7500 Å equivalent to the thickness of the first insulating film and the first and second etching stop films.

Figure 2C:
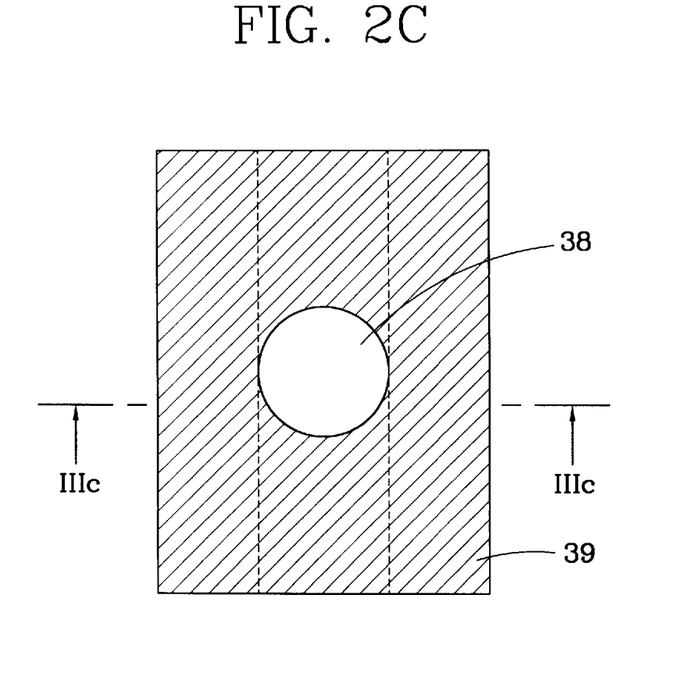
Figure 3C:
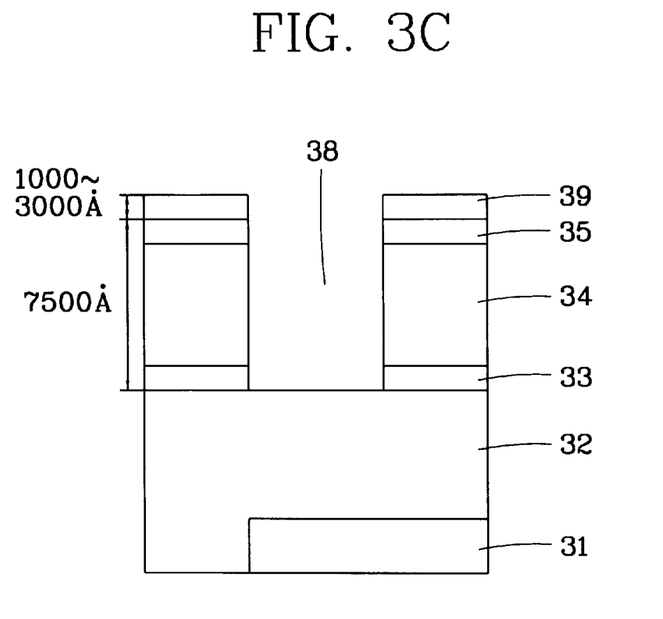

Then, in FIG. 2C or 3C, a second photoresist film is formed at a thickness of 1000–3000 Å on an entire surface of the resultant structure of FIG. 2B or 3B. In that case, a photoresist film is about 8500–10500 Å which is 7500 Å of the photoresist film in addition to 1000–3000 Å. Next, an opening 38 to form a via hole is provided by which a photolithography process is performed to the second photoresist film. As a result, the second photoresist film becomes a second photoresist film pattern 39 having the opening 38. Here, the second photoresist film pattern 39 is to be referred to a via hole mask since the pattern 39 serves as a mask for forming a via hole. When forming the via hole mask 39, since the thickness of the photoresist film formed in the trench is 8500–10500 Å which is considerably thinner than the thickness of 14500–16500 Å formed in the conventional art, the resolution thereof much improves. As can be seen in FIG. 5, the resolution improves as the photoresist film becomes thinner, which has an effect of dealing with pattern minimization according to the miniaturization of semiconductor devices. Further, since the depth of focus is ranged between 0.4–0.6 μm in the general photolithography process, if the focus is brought into a center point of the photoresist film at the thickness of 8500–10500 Å, the photoresist film is sufficiently exposed to the light from the top to bottom surfaces thereof and thus no bridge is formed when forming a fine hole.

Figure 6:
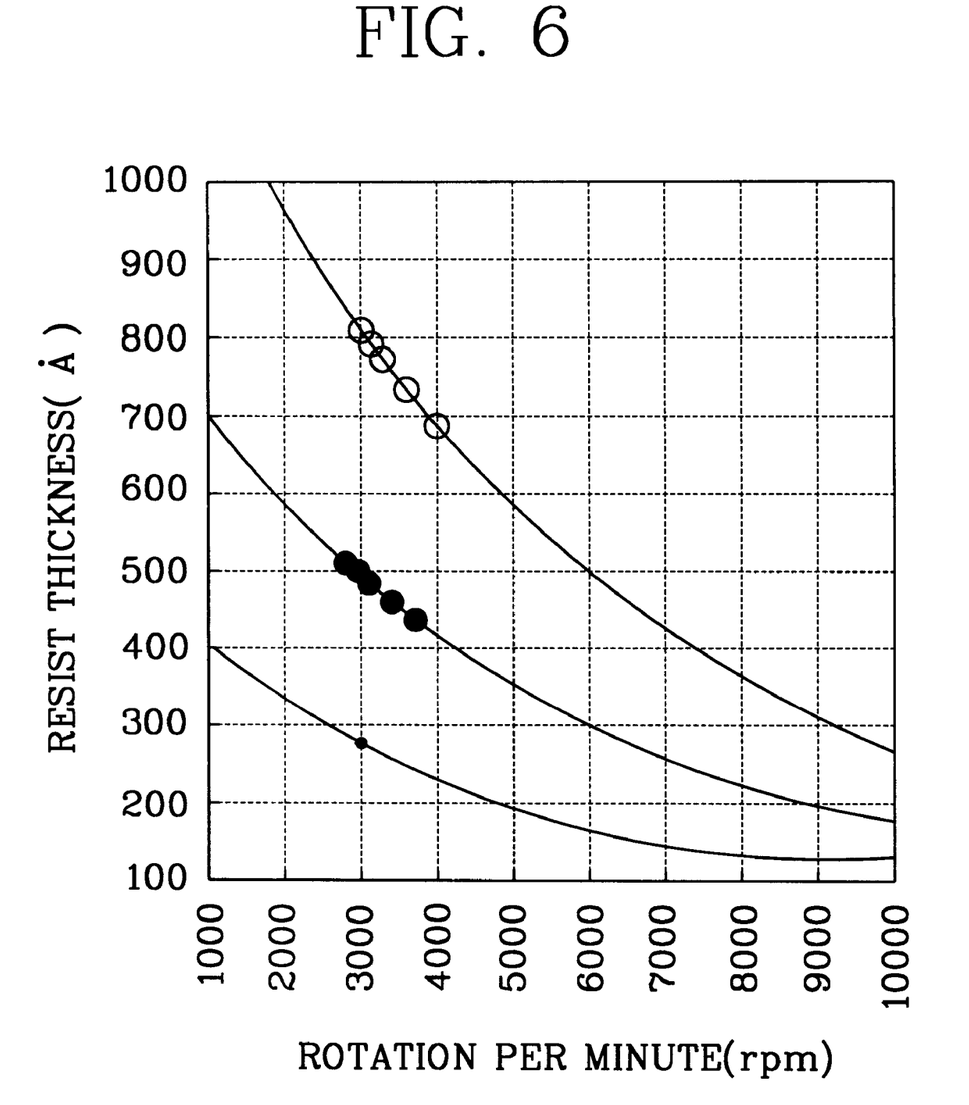
FIG. 6 is a graph illustrating relation between wafer rotation speed in application of a photoresist film and a thickness of the photoresist film in accordance with each viscosity of the photoresist film.

Such relatively thin photoresist film according to the present invention is formed by a fabricating method as follows. More specifically, in the conventional art, to form the photoresist film at the thickness of 8000 Å, the photoresist film is coated by using the photoresist at 8 cP of the viscosity while rotating the semiconductor device at 3000 rpm. While, in the present invention, the rotation speed of the semiconductor substrate remains at 3000 rpm as in the conventional art and the viscosity of the photoresist is reduced to 2 cP to form the photoresist film having a thickness under 3000 Å, as shown in FIG. 6. Here, the viscosity of the photoresist can be reduced by increasing content of a solvent of the photoresist. In the graph, when the viscosity of the photoresist is 5cP, the content of the solvent thereof is 80%. Accordingly, to reduce the viscosity of the photoresist lower than 5 cP, the content of the solvent is preferably increased up to 90–95%. There is another method to form a thin photoresist film in which the rotation speed of the semiconductor device is increased when coating the photoresist film without any change of the viscosity of the photoresist. That is, as shown in FIG. 6, when using the photoresist having 5 cP of the viscosity in order to have the thickness of the photoresist under 3000 Å, the photoresist film is formed at the rotation speed of the semiconductor substrate over about 6000 rpm. That is, the thickness of the photoresist film can be preferably controlled by reducing the viscosity of the photoresist or increasing the rotation speed of the semiconductor substrate.

Further, it is desirable that a plane figure of the opening 38 of the via hole mask 39 of FIG. 3C has a rectangular or an oval shape 38a which is vertically formed to the longitudinal direction of the trench 37 as shown in FIG. 2C' or 3C'. Here, it is desirable that the horizontal cross-section of the opening 38a is formed larger than that of the via hole. Namely, when the opening 38a has the oval shape, the diameter of the major axis of the oval is larger than the desired diameter of the via hole, and the direction of the major axis is perpendicular to the longitudinal direction of the trench 37. Also, the diameter of the minor axis b is the same as the desired size of the via hole. In addition, as shown in FIG. 2C'' and 3C'', as another type of the opening 38, there is formed a line-type opening 38b which is formed perpendicular to the longitudinal direction of the trench 37.

Figure 4:
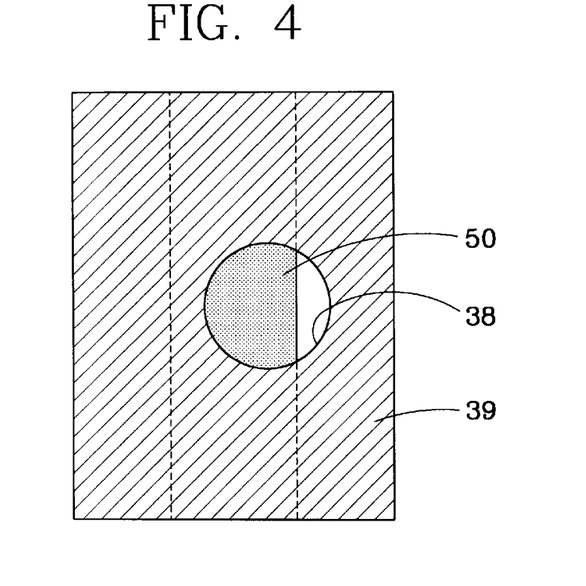
FIG. 4 is a plane view illustrating misalignment of a via hole mask.

When the size of the opening is formed larger than the size of the via hole, that is the size of the opening 38 of FIG. 2C, in the direction perpendicular to the longitudinal direction of the trench, there is an advantage as follows. The via hole mask 39 should be formed by being accurately aligned with the trench 37. However, in the conventional art, when the opening 38 of the via hole mask 39 is formed at the left side (or the right side) of the desired position as shown in FIG. 4 due to the misalignment, a portion 50 (the dotted portion in FIG. 4) in which the trench 37 and the opening 38 cross each other is reduced, the portion 50 being an area of the trench 37 which is exposed through the opening 38. Consequently, in the following via hole etching process, the size of the via hole decreases compared to the intended size thereof, which leads to increase in the contact resistance between the upper and lower conductive wirings or the inferior contact therebetween. While, in the present invention as shown in FIGS. 2C' and 2C'', if the opening 38a, 38b is formed larger than the Intended size of the via hole, the size of the via hole does not decrease although the misalignment occurs in the light exposure for forming the second photoresist pattern 39.

Figure 2D:
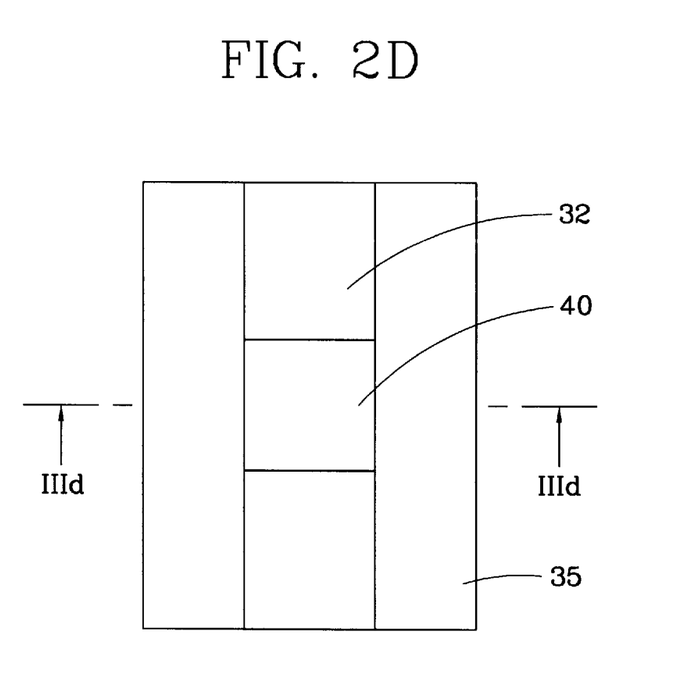
Figure 3D:
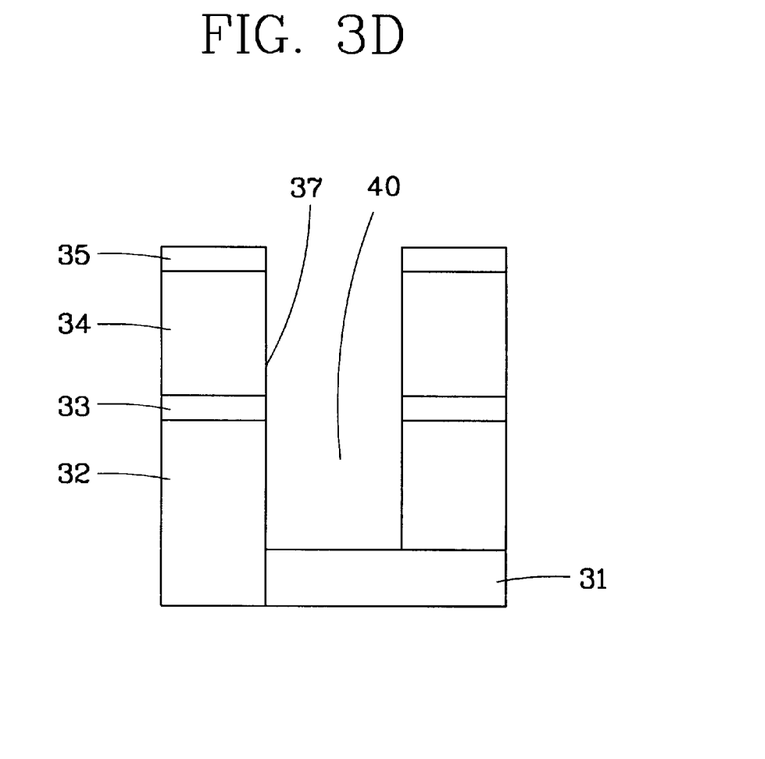

In the present invention, the main reason why the opening to form the via hole can be formed larger than the size of the via hole is because the second etching stop film is formed on the second insulating film. More specifically, even though the opening is formed larger then the intended size of via hole, the etching of the second insulating film is prevented and thus the shape of the trench 37 remains with no change during the via hole etching process. However, it is noted that the size of the opening should not be increased in the longitudinal direction of the trench, because the etching stop film is not formed on the bottom surface of the trench and therefore if the opening is enlarged in the longitudinal direction of the trench, the first insulating film is etched as the size of the opening and thus formed lager than the intended size of the via hole. As described above, after the via hole mask 39, 39a, 39b is formed, a via hole 40 as shown in FIG. 2D is formed by etching the first insulating film 32 provided on the bottom surface of the trench 37, using one of the via hole masks 39, 39a, 39b. Here, preferably, the etching process is performed by high density plasma reactive ion etching (HDP RIE) by using the mixture of $C_2F_6$ and $C_4F_8$. As shown in FIG. 2D, the via hole 40 is formed by using the second photoresist pattern 39b of FIG. 2C'' as a mask, and FIG. 3D is a vertical cross-sectional view of FIG. 2O in accordance with IIId—IIId. Next, the via hole mask 39b is removed.

Then, a conductive metal film is deposited on an entire surface the resultant structure of FIG. 2D. Particularly, Al or Cu is used as the material of the metal film. Here, it is noted that the metal film is thickly deposited to be completely filled in the via hole 40 and the trench 37 and formed on the second etching stop film 35, and FIG. 3E is the resultant structure thereof and FIG. 3E is a vertical cross-sectional view of FIG. 2E in accordance with IIIe—IIIe.

Figure 2E:
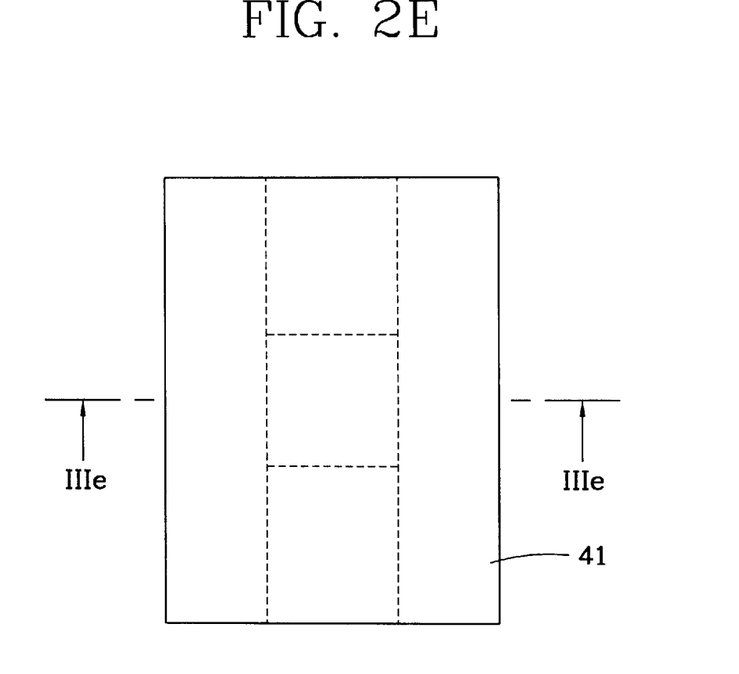
Figure 2F:
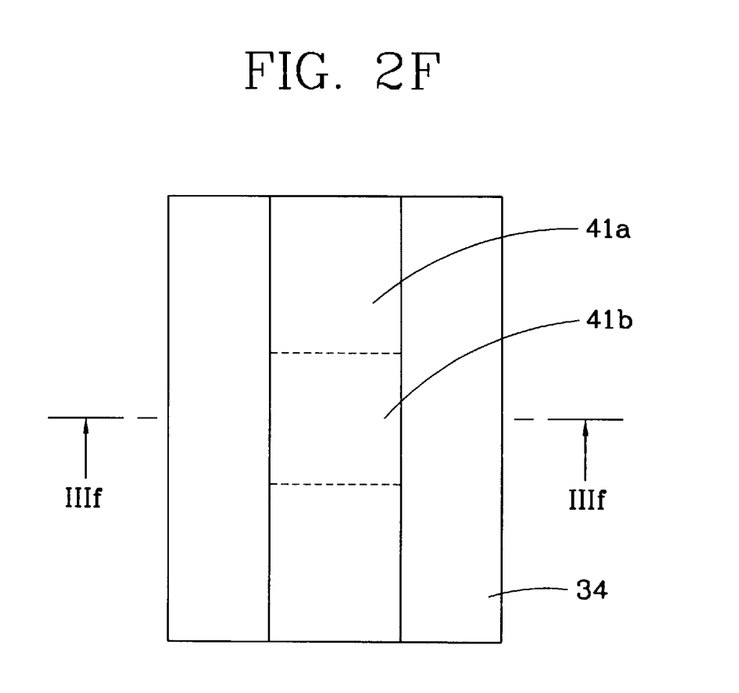
Figure 3E:
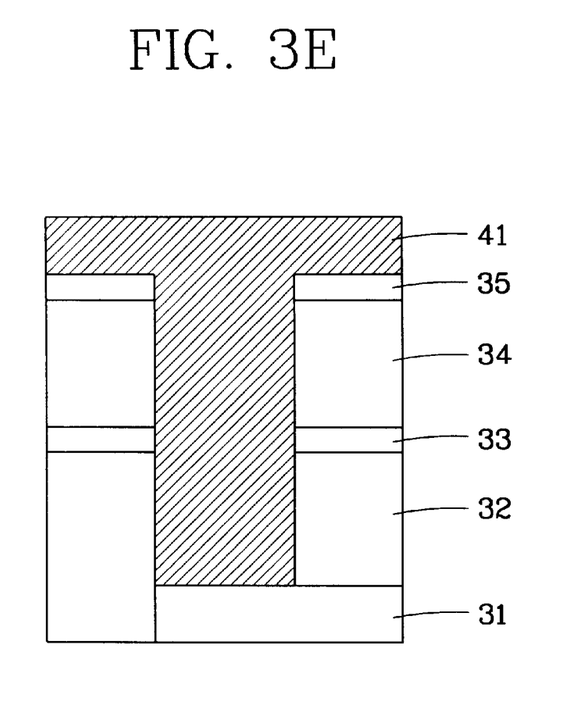
Figure 3F:
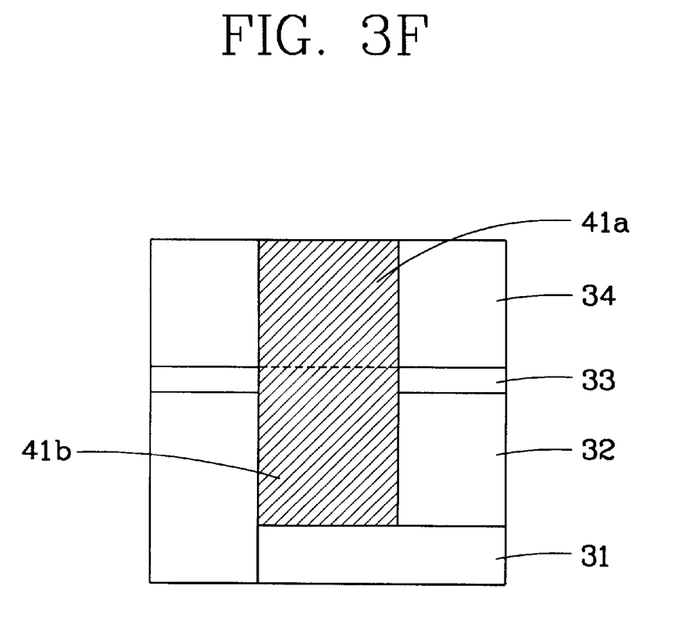

Finally, the chemical mechanical polishing process is applied to the structure of FIG. 2E until the second insulating film 34 is exposed, thereby completing the fabrication of the multi-level wiring structure for the semiconductor device as shown in FIG. 3F which is a vertical cross-sectional view of FIG. 2F in accordance with IIIf—IIIf. As a result, the multi-wiring structure for the semiconductor device according to the present invention has an upper conductive layer 41a filled in the trench 37, and an interconnect 41b filled in the via hole 40 for connecting the upper conductive layer 41a with the lower conductive layer pattern 31.

As described above, the multi-level wiring structure according to the present invention is fabricated by the dual damascene process under the condition that the etching stop films are respectively formed on the top surface of the multi-level insulating films. Thus, when forming the via hole mask to form the via hole after the trench is formed in the etching stop films, the photoresist film is formed thinner than that of the conventional art. Therefore, the resolution of the photoresist film pattern is improved, which results in improvement of the reliability of the semiconductor device. In addition, since the present invention prevents the size reduction of the via hole due to the misalignment of the via hole mask when forming the via hole mask for forming the via hole, the problems in the conventional art, such as the contact resistance and the inferior contact of the wiring, which also improves the reliability of the semiconductor device.

It will be apparent to those skilled In the art that various modifications and variations can be made in the fabricating method of the multi-level wiring structure for the semiconductor device of the present invention without departing from the spirit or scope of the invention. Thus, it is intended that the present invention cover the modifications and variations of this invention provided they come within the scope of the appended claims and their equivalents.

What is claimed is:

1. A fabricating method of a multi-level wiring structure for a semiconductor device, comprising:

sequentially forming a first insulating film, a first etching stop film, a second insulating film and a second etching stop film on a conductive layer pattern;

forming a trench by etching the second etching stop film, the second insulating film and the first etching stop film;

forming a photoresist film in the trench and on an upper surface of the second etching stop film, wherein a thickness of the photoresist film ranges between 1000–3000 Å;

exposing an upper surface of the first insulating film by forming an opening in the photoresist film formed in the trench;

forming a via hole by etching the exposed portion of the first insulating film to thereby expose a portion of the conductive layer pattern; and filling a conductive material in the via hole and the trench.

2. The fabricating method of the multi-level wiring structure for the semiconductor device according to claim 1, wherein the opening has a rectangular shape which is perpendicularly formed to a longitudinal direction of the trench and the upper surface of the second etching stop film is at least partially exposed through the opening.

3. The fabricating method of the multi-level wiring structure for the semiconductor device according to claim 1, wherein the opening has an oval shape in which a diameter perpendicular to the longitudinal direction of the trench is larger than a diameter in the longitudinal direction thereof.

4. The fabricating method of the multi-level wiring structure for the semiconductor device according to claim 3, wherein the upper surface of the second etching stop film is at least partially exposed through the opening.

5. The fabricating method of the multi-level wiring structure for the semiconductor device according to claim 1, wherein the opening is a line-type opening perpendicularly extended in the longitudinal direction of the trench.

6. The fabricating method of the multi-level wiring structure for the semiconductor device according to claim 1, wherein a material of the first and second insulating films is a silicon oxide film or a TEOS film.

7. The fabricating method of the multi-level wiring structure for the semiconductor device according to claim 1, wherein a material of the first and second etching stop films is a silicon nitride film.

8. The fabricating method of the multi-level wiring structure for the semiconductor device according to claim 1, wherein in the process of forming the photoresist film, a photoresist having 2cP of a viscosity is coated by rotating a semiconductor substrate at least at 3000 rpm.

9. The fabricating method of the multi-level wiring structure for the semiconductor device according to claim 1, wherein in the process of forming the photoresist film, a photoresist having 5 cP of a viscosity is coated by rotating a semiconductor substrate at least at 6000 rpm.

10. The fabricating method of the multi-level wiring structure for the semiconductor device according to claim 1, wherein a material of the conductive layer pattern is Al or Cu.

11. The fabricating method of the multi-level wiring structure for the semiconductor device according to claim 1, wherein the conductive material filled in the via hole and the trench is Al or Cu.

12. The fabricating method of the multi-level wiring structure for the semiconductor device according to claim 1, wherein the process of filling the conductive material in the via hole and the trench comprises:

removing the photoresist pattern after forming the via hole;

forming a metal film on the upper surface of the second etching stop film and in the via hole and the trench; and applying a chemical mechanical polishing to the metal film until a surface of the second insulating film is exposed.

* * * * *